(12) United States Patent
Rouh et al.

(10) Patent No.: US 9,318,390 B2
(45) Date of Patent: Apr. 19, 2016

(54) CMOS CIRCUIT AND METHOD FOR FABRICATING THE SAME

(71) Applicant: SK hynix Inc., Gyeonggi-do (KR)

(72) Inventors: Kyong-Bong Rouh, Gyeonggi-do (KR);
Shang-Koon Na, Gyeonggi-do (KR);
Mi-Ri Lee, Gyeonggi-do (KR);
Hun-Sung Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/618,830

(22) Filed: Feb. 10, 2015

(65) Prior Publication Data

US 2015/0155207 A1   Jun. 4, 2015

Related U.S. Application Data

(63) Continuation of application No. 13/845,184, filed on Mar. 18, 2013, now Pat. No. 8,981,486.

(30) Foreign Application Priority Data

Dec. 28, 2012   (KR) .......................... 10-2012-0157246

(51) Int. Cl.
*H01L 21/8238* (2006.01)
*H01L 21/02* (2006.01)
*H01L 21/225* (2006.01)
*H01L 21/28* (2006.01)
*H01L 21/324* (2006.01)

(52) U.S. Cl.
CPC .. *H01L 21/823814* (2013.01); *H01L 21/02532* (2013.01); *H01L 21/02592* (2013.01); *H01L 21/2251* (2013.01); *H01L 21/28035* (2013.01); *H01L 21/324* (2013.01); *H01L 21/8238* (2013.01); *H01L 21/823828* (2013.01); *H01L 21/823842* (2013.01)

(58) Field of Classification Search
CPC ................... H01L 21/8238; H01L 21/823828; H01L 21/823842
See application file for complete search history.

(56) References Cited

U.S. PATENT DOCUMENTS

| | | | | |
|---|---|---|---|---|
| 6,252,283 B1 * | 6/2001 | Gardner et al. | ............... | 257/407 |
| 2007/0080411 A1 * | 4/2007 | Enicks | ............ | 257/410 |
| 2014/0001541 A1 * | 1/2014 | Rouh et al. | ..................... | 257/330 |

* cited by examiner

*Primary Examiner* — Phat X Cao
(74) *Attorney, Agent, or Firm* — IP & T Group LLP

(57) ABSTRACT

A semiconductor device includes a semiconductor substrate and a gate insulation layer formed over the semiconductor substrate. A gate electrode is formed over the gate insulation layer. The gate electrode includes a silicon-containing electrode including a dopant, a capturing material to capture the dopant, and an activation control material to control an activation of the dopant.

6 Claims, 7 Drawing Sheets

CMOS CIRCUIT AND METHOD FOR FABRICATING THE SAME

CROSS-REFERENCE TO RELATED APPLICATIONS

This application is a continuation of U.S. patent application Ser. No. 13/845,184 filed on Mar. 18, 2013, which claims priority of Korean Patent Application No. 10-2012-0157246, filed on Dec. 28, 2012. The disclosure of each of the foregoing application is incorporated herein by reference in its entirety.

BACKGROUND

1. Field

Exemplary embodiments of the present invention relate to a semiconductor device, and more particularly, to a CMOS circuit and a method for fabricating the CMOS circuit.

2. Description of the Related Art

Transistors such as Metal Oxide Silicon Field Effect Transistors (MOSFET) include polysilicon as a gate electrode. Since polysilicon contains a conductive impurity, which is a dopant such as phosphorus (P) and boron (B), a low resistance value may be obtained.

A Complementary Metal Oxide Semiconductor (CMOS) circuit includes NMOSFET and PMOSFET. NMOSFET includes a polysilicon gate containing an N-type dopant, which is referred to as an N-type polysilicon gate, hereafter, while PMOSFET includes a polysilicon gate containing a P-type dopant, which is referred to as a P-type polysilicon gate, hereafter. The N-type polysilicon gate includes phosphorus (P), while the P-type polysilicon gate includes boron (B).

Controlling saturated current of a transistor is significant for high-speed operation of a memory device, such as a Dynamic Random Access Memory (DRAM) device and flash memory device. The control of the saturated current is related to a polysilicon depletion ratio (PDR).

However, the problem with the control of the saturated current is that two significant characteristics in the formation of the P-type polysilicon gate are in a trade-off relationship. One is a boron penetration phenomenon and the other is a polysilicon depletion ratio (PDR). The boron penetration phenomenon means that boron (B) doping the inside of a polysilicon gate penetrates into a gate insulation layer. The polysilicon depletion ratio (PDR) means that the doping concentration in the lower portion of the polysilicon gate is decreased. When the boron penetration phenomenon occurs or the polysilicon depletion ratio (PDR) characteristics are poor, the operation characteristics of a transistor are deteriorated.

As described above, a method of further containing capturing materials to improve the boron penetration phenomenon and the deteriorated polysilicon depletion ratio of the P-type polysilicon gate have been suggested.

The doping concentration of a dopant may be increased by including a capturing material for capturing a dopant in a polysilicon gate and thus having the dopant piled up around the gate insulation layer. In this way, the polysilicon depletion ratio may be improved. Also, since the capturing material prevents boron from penetrating, the boron penetration phenomenon may be suppressed.

However, in case of the N-type polysilicon gate containing capturing materials, since an N-type dopant is excessively piled up around the gate insulation layer, gate oxide breakdown voltage is deteriorated.

SUMMARY

An exemplary semiconductor device includes a semiconductor substrate; a gate insulation layer formed over the semiconductor substrate; a gate electrode formed over the gate insulation layer, the gate electrode including a silicon-containing electrode including a dopant, a capturing material to capture the dopant, and an activation control material to control an activation of the dopant.

An exemplary CMOS circuit includes a PMOSFET gate including a P-type doped silicon-containing electrode including a P-type dopant, a first capturing material to capture the P-type dopant, and an activation promoting material to promote activation of the P-type dopant; and an NMOSFET gate including an N-type doped silicon-containing electrode including an N-type dopant, a second capturing material to capture the N-type dopant, and an activation suppressing material to suppress an activation of the N-type dopant.

An exemplary method for fabricating a semiconductor device includes forming a gate insulation layer over a semiconductor substrate; forming a silicon-containing layer over the gate insulation layer; forming a doped silicon-containing layer by doping the silicon-containing layer with a dopant; and forming a gate electrode by etching the doped silicon-containing layer, wherein the silicon-containing layer includes a capturing material to capture the dopant and an activation control material to control an activation of the dopant. The method may further comprise forming a source region and a drain region on opposite sides of the gate electrode; and annealing a resultant structure of the forming the source region and the drain region. The capturing material may include carbon, and the activation control material includes germanium. The forming the silicon-containing layer may comprise forming a multi-layer structure including: the silicon-containing layer that contains the capturing material, and an undoped silicon-containing layer that contains the activation control material. The forming the silicon-containing layer may comprise forming a multi-layer structure including: an amorphous silicon layer that contains the capturing material, and an undoped amorphous silicon layer that contains the activation control material. The capturing material may include carbon. The activation control material may include germanium. The germanium may have a concentration of approximately 20 at % to approximately 40 at %. The forming the amorphous silicon layer may comprise forming a multi-layer structure including: an undraped amorphous silicon layer that contains the capturing material, and an undoped amorphous silicon-containing layer that contains the activation control material.

An exemplary method for fabricating a CMOS circuit includes forming a gate insulation layer over a semiconductor substrate having an NMOSFET region and a PMOSFET region; forming an amorphous silicon layer over the gate insulation layer; forming a P-type doped amorphous silicon layer and an N-type doped amorphous silicon layer by doping the amorphous silicon layer with a P-type dopant and an N-type dopant, respectively; forming gate structures by etching the P-type doped amorphous silicon layer and the N-type doped amorphous silicon layer; and annealing the gate structures to activate the P-type dopant and the N-type dopant, wherein the amorphous silicon layer contains a capturing material to capture the P-type dopant and the N-type dopant, and an activation control material to control an activation of the P-type dopant and the N-type dopant.

DETAILED DESCRIPTION

Figure 1A:
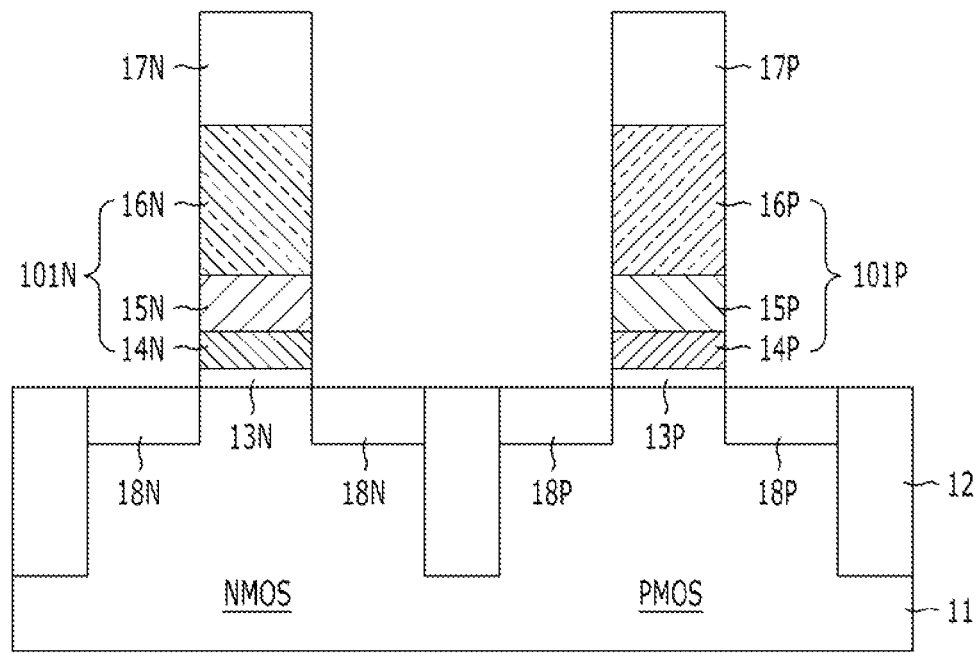
FIG. 1A is a cross-sectional view illustrating an exemplary CMOS circuit.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 1B:
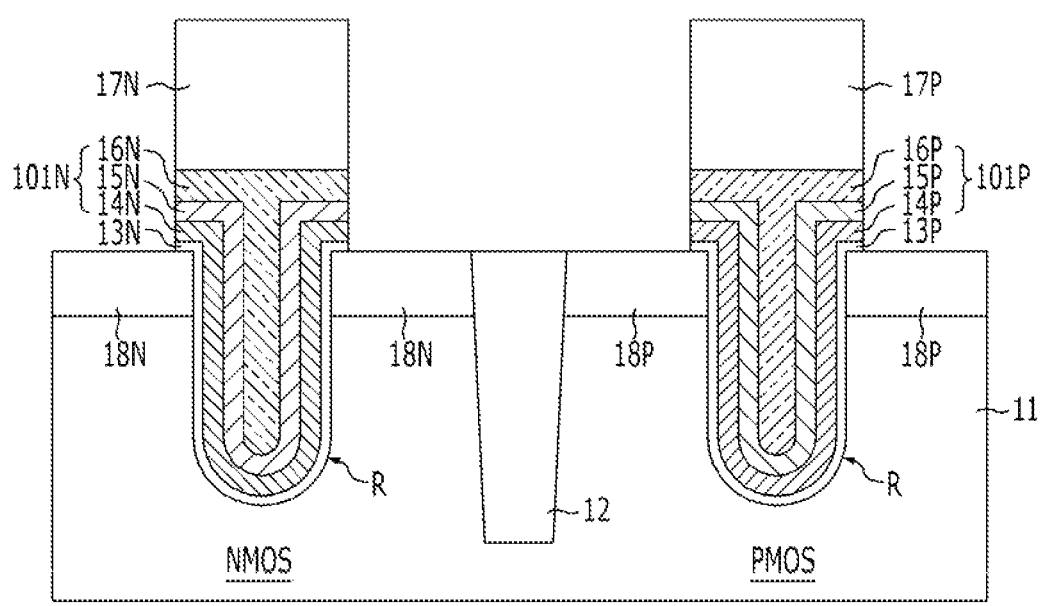
FIG. 1B is a cross-sectional view illustrating an exemplary modified CMOS circuit.

FIG. 1A is a cross-sectional view illustrating an exemplary Complementary Metal Oxide Semiconductor (CMOS). FIG. 1B is a cross-sectional view illustrating an exemplary modified CMOS circuit. FIG. 1A shows a CMOS circuit having a planar gate structure, whereas FIG. 1B shows a CMOS circuit having a recess gate structure.

Referring to FIGS. 1A and 1B, a semiconductor substrate 11 includes a first region and a second region. The semiconductor substrate 11 also includes an isolation region 12 for isolating the first region and the second region from each other. The isolation region 12 is of a trench structure, which may be formed through a Shallow Trench Isolation (STI) process. The isolation region 12 may include an insulation layer, e.g., a silicon oxide layer. The first region and the second region may include a transistor region. The first region and the second region may include a PMOSFET region and an NMOSFET region, respectively. Hereafter, the first region where a PMOSFET is formed is a PMOS region, and the second region where an NMOSFET is formed is an NMOS region. The positions of the first PMOS region and the second NMOS region are illustrated for the sake of convenience in description, and the positions may be switched with each other. The semiconductor substrate 11 may include, for example, a silicon substrate, a germanium substrate, or a silicon germanium substrate. Moreover, the entire semiconductor substrate or a part of the semiconductor substrate 11 may be strained.

A gate structure is formed over the semiconductor substrate 11 of each of the first PMOS region and the second NMOS region. The gate structures illustrated in FIG. 1A may include a planar gate structure. The planar gate structure is a gate structure where a horizontal channel is formed. The gate structures illustrated in FIG. 1B may include a recess gate structure. The recess gate structure is a gate structure formed in a recess pattern R. The recess gate structure has a longer channel length than the planar gate structure.

The gate structure of the first PMOS region may include a first gate insulation layer 13P, a P-type doped silicon-containing electrode 101P, and a first metal electrode 17P. A P-type source/drain region 18P is formed in the inside of the semiconductor substrate 11 on both sides of each gate structure. The first gate insulation layer 13P may include a silicon oxide or a high dielectric material. If the first gate insulation layer 13P includes a high dielectric material, then an interface layer, such as a silicon oxide layer or a silicon oxynitride layer, may be formed between the semiconductor substrate 11 and the high dielectric material. The P-type doped silicon-containing electrode 101P may be doped with a P-type dopant and may further include a first capturing material and a first activation control material. The P-type doped silicon-containing electrode 101P may include a first P-type doped silicon-containing electrode 14P, a second P-type doped silicon-containing electrode 15P, and a third P-type doped silicon-containing electrode 16P. The P-type doped silicon-containing electrode 101P may include polysilicon. The P-type doped silicon-containing electrode 101P may include polysilicon produced by crystallizing amorphous silicon. The first P-type doped silicon-containing electrode 14P, the second P-type doped silicon-containing electrode 15P, and the third P-type doped silicon-containing electrode 16P may include doped polysilicon that is doped with a P-type dopant. The P-type dopant may include boron (B). The first P-type doped silicon-containing electrode 14P may include the first capturing material. The second P-type doped silicon-containing electrode 15P may include the first activation control material. The third P-type doped silicon-containing electrode 16P does not contain the first capturing material or the first activation control material, but is doped with the P-type dopant. The first capturing material may include carbon, and the first activation control material may include germanium (Ge). Carbon is a material that captures boron (B), and germanium (Ge) controls the activation of boron (B) and promotes the activation of boron (B). The first metal electrode 17P may include a low-resistance material. For example, the first metal electrode 17P may include a tungsten-containing material or a titanium-containing material.

Referring to FIG. 1B, the P-type doped silicon-containing electrode 101P fills the recess pattern R, and the first metal electrode 17P is formed over the P-type doped silicon-containing electrode 101P.

The gate structure of the second NMOS region includes a second gate insulation layer 13N, an N-type doped silicon-containing electrode 101N, and a second metal electrode 17N.

An N-type source/drain region 18N is formed in the inside of the semiconductor substrate 11 on both sides of each gate structure. The second gate insulation layer 13N may include a silicon oxide or a high dielectric material. If the second gate insulation layer 13N includes a high dielectric material, then an interface layer, such as a silicon oxide layer or a silicon oxynitride layer, may be formed between the semiconductor substrate 11 and the high dielectric material. The N-type doped silicon-containing electrode 101N may be doped with an N-type dopant and may further include a second capturing material and a second activation control material. The N-type doped silicon-containing electrode 101N may include a first N-type doped silicon-containing electrode 14N, a second N-type doped silicon-containing electrode 15N, and a third N-type doped silicon-containing electrode 16N. The N-type doped silicon-containing electrode 101N may include polysilicon. The N-type doped silicon-containing electrode 101N may include polysilicon produced by crystallizing amorphous silicon. The first N-type doped silicon-containing electrode 14N, the second N-type doped silicon-containing electrode 15N, and the third N-type doped silicon-containing electrode 16N may include doped polysilicon that is doped with an N-type dopant. The N-type dopant may include phosphorus (P). The first N-type doped silicon-containing electrode 14N may include the second capturing material. The second N-type doped silicon-containing electrode 15N may include the second activation control material. The third N-type doped silicon-containing electrode 16N does not contain the second capturing material or the second activation control material, but is doped with the N-type dopant. The second capturing material may include carbon, and the second activation control material may include germanium (Ge). Carbon is a material that captures phosphorus (P), and germanium (Ge) controls the activation of phosphorus (P) and suppresses the activation of phosphorus (P). The second metal electrode 17N may include a low-resistance material. For example, the second metal electrode 17N may include tungsten-containing material or titanium-containing material.

Referring to FIG. 1B, the N-type doped silicon-containing electrode 101N fills the recess pattern R, and the second metal electrode 17N is formed over the N-type doped silicon-containing electrode 101N.

Referring to FIGS. 1A and 15, the P-type doped silicon-containing electrode 101P includes the first capturing material and the first activation control material. The N-type doped silicon-containing electrode 101N includes the second capturing material and the second activation control material. Both the first capturing material and the second capturing material may include carbon, and both the first activation control material and the second activation control material may include germanium (Ge). The first capturing material increases the concentration of the P-type dopant at the interface between the first gate insulation layer 13P and the P-type doped silicon-containing electrode 101P. The second capturing material increases the concentration of the N-type dopant at the interface between the second gate insulation layer 13N and the N-type doped silicon-containing electrode 101N. Thus, the polysilicon depletion ratio (PDR) of the NMOSFET and the PMOSFET may be improved and the current may be increased.

The first activation control material promotes activation, while the second activation control material suppresses activation. For example, the second activation control material suppresses activation of phosphorus (P), while the first activation control material promotes activation of boron (B). The first activation control material and the second activation control material include germanium (Ge). Germanium (Ge) suppresses the activation of phosphorus (P), while promoting the activation of boron (B). The germanium (Ge) included in the P-type doped silicon-containing electrode 101P activates the boron (B) captured by the first P-type doped silicon-containing electrode 14P. The activation of the dopant is controlled according to the amount of germanium (Ge). To be specific, the concentration of germanium (Ge) may range from approximately 20 at % to approximately 40 at %.

The concentration of phosphorus (P) may be increased by the second capturing material, but this brings about excessive accumulation of phosphorus (P), which leads to deteriorated gate breakdown voltage and threshold voltage Vt. Therefore, the activation of excess phosphorus (P) at the first N-type doped silicon-containing electrode 14N may be prevented by forming the second N-type doped silicon-containing electrode 15N containing the second activation control material. In other words, germanium (Ge), which is the second activation control material, deactivates phosphorus (P). Therefore, the excess phosphorus (P) may be prevented from penetrating into the second gate insulation layer 13N and the channel region under the second gate insulation layer 13N.

Thus, the first capturing material and the second capturing material improve the polysilicon depletion ratio (PDR) of the PMOSFET and the NMOSFET, and the second activation control material prevents the gate breakdown voltage and threshold voltage of the NMOSFET from being decreased. Moreover, the first activation control material increases the activation of boron (B).

Also, since the capturing material is disposed over the gate insulation layer, the dopant may be prevented from diffusing into the gate insulation layer and the channel region. Therefore, a process of nitriding the surface of the gate insulation layer for preventing the penetration of the dopant may be omitted. Since it does not have to consider the dopant that penetrates and diffuses into the gate insulation layer and the channel region, the concentration of the dopant doping the silicon-containing electrode may be decreased. The decreased concentration of the dopant may be compensated for by using the activation efficiency of germanium (Ge).

FIGS. 2A to 2F are cross-sectional views illustrating an exemplary method of forming the exemplary CMOS circuit. The method is not limited to manufacturing a CMOS circuit, and may be used to manufacture any semiconductor device, including a NMOSFET and a PMOSFET. The NMOSFET and the PMOSFET may be formed in a CMOS circuit. The CMOS circuit may include at least one PMOSFET and at least one NMOSFET. A sense amplifier may include a CMOS circuit.

Figure 2A:
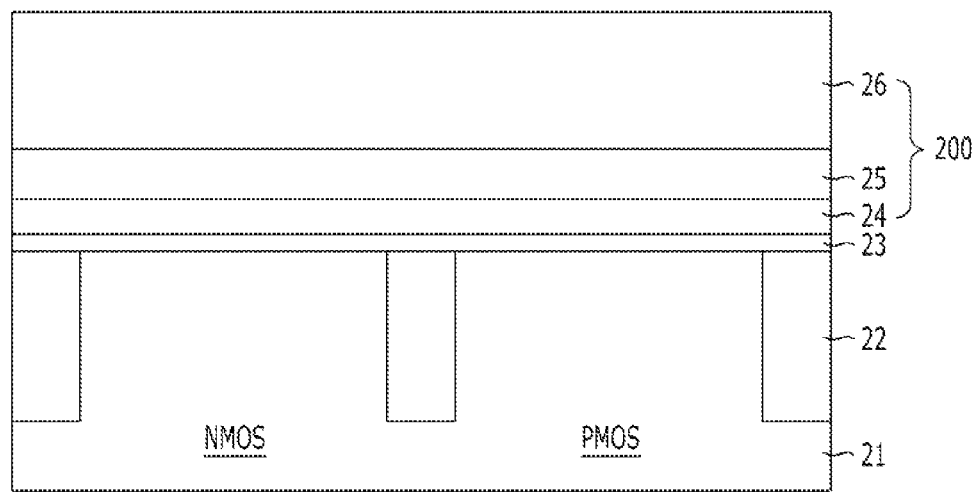
FIGS. 2A to 2F are cross-sectional views illustrating an exemplary method of manufacturing a CMOS circuit.

Referring to FIG. 2A, a semiconductor substrate 21 includes a plurality of transistor regions. The multiple transistor regions may include a first region and a second region. The semiconductor substrate 21 also includes an isolation region 22 for isolating the first region and the second region. The isolation region 22 is of a trench structure, which may be formed through a Shallow Trench Isolation (STI) process. The isolation region 22 may include an insulation layer, e.g., a silicon oxide layer. The first region may include a region where a PMOSFET is formed, and the second region may include a region where an NMOSFET is formed. Hereafter, the first region is a PMOS where a PMOSFET is formed, and the second region is an NMOS where an NMOSFET is formed. The positions of the first PMOS region and the second NMOS region, are illustrated for the sake of convenience in description, and the positions may be switched with each other. The semiconductor substrate 21 may include, for example, a silicon substrate, a germanium substrate, and a silicon germanium substrate. Moreover, the entire or part of the semiconductor substrate 21 may be strained.

Although not illustrated in the drawing, a first well and a second well may be formed in the first PMOS region and the second NMOS region, respectively, through a typical well forming process. An N-type first well may be formed in the first PMOS region, and a P-type second well may be formed in the second NMOS region. To form the N-type first well, an N-type dopant, e.g., phosphorus (P) or arsenic (As), may be implanted into the first region, which is the PMOS, of the semiconductor substrate 21. Also, to form the P-type second well, a P-type dopant, e.g., boron (B), may be implanted into the second NPMOS region, of the semiconductor substrate 21. Although not illustrated in the drawing either, an impurity may be ion-implanted to control a threshold voltage. This process is referred to as a threshold voltage control ion implantation process, hereafter. During the threshold voltage control ion implantation process, an impurity appropriate for the channel of a transistor may be selected. Before the threshold voltage control ion implantation process, a sacrificial layer (not shown) may be formed on the surface of the semiconductor substrate 21. The sacrificial layer may be formed through a thermal oxidation process, and it may be removed after the threshold voltage control ion implantation process.

Subsequently, a gate insulation layer 23 is formed over the semiconductor substrate 21. The gate insulation layer 23 may include a silicon oxide, a silicon nitride, or a high dielectric material. The gate insulation layer 23 may be formed through a thermal oxidation process, a plasma oxidation process, an atomic layer deposition process, or a chemical vapor deposition process. Subsequently, the gate insulation layer 23 may be nitrided. The high dielectric material includes a material having a high dielectric rate (high-k). The high dielectric material generally has a dielectric rate higher than the dielectric rate of silicon dioxide ($SiO_2$), which is approximately 3.9. Also, the high dielectric material is physically thicker than silicon oxide ($SiO_2$) and has a lower Equivalent Oxide Thickness (EOT). For example, the high dielectric material may include a metal-containing material, such as a metal oxide or a metal silicate. The metal oxide may include an oxide containing a metal, such as hafnium (Hf), aluminum (Al) lanthanum (La), or zirconium (Zr). The metal oxide may include hafnium oxide ($HfO_2$), aluminum oxide ($Al_2O_3$) lanthanum oxide ($La_2O_3$), zirconium oxide ($ZrO_2$) or a combination thereof. The metal silicate may include a silicate containing a metal, such as hafnium (Hf) or zirconium (Zr). The metal silicate may include hafnium silicate ($HfSiO_x$), zirconium silicate ($ZrSiO_x$), or a combination thereof. The process of forming the high dielectric material may include a deposition technology appropriate for the material to be deposited. For example, deposition process may include a Chemical Vapor Deposition (CVD) process, a Low-Pressure CVD (LPCVD) process, a Plasma-Enhanced CVD (PECVD) process, a Metal-Organic CVD (MOCVD) process, an Atomic Layer Deposition (ALD) process, or a Plasma-Enhanced ALD (PEALD) process. A PEALD process may be used to form a thin film uniformly. The high dielectric material may be exposed through a subsequent nitridation process. The nitridation process may include a Plasma Nitridation process, during which nitrogen is implanted into the high dielectric material. For example, if the high dielectric material is hafnium silicate (HfSiO), the HfSiON is formed after the nitridation process. When nitrogen is implanted into a metal silicate, then the dielectric constant is increased, and crystallization of the metal silicate may be suppressed during a subsequent thermal process.

If the gate insulation layer 23 includes a high dielectric material, then an interface layer may be formed between the semiconductor substrate 21 and the high dielectric material. The interface layer may include a silicon oxide or a silicon oxynitride.

Subsequently, a gate conductive layer is formed over the semiconductor substrate 21 including the gate insulation layer 23. The gate conductive layer may include a silicon-containing layer 200. The silicon-containing layer 200 contains silicon as its major component and may further contain a capturing material and an activation control material. The silicon-containing layer 200 may include a silicon layer. The silicon-containing layer 200 may include a silicon layer containing a capturing material and an activation control material. The capturing material captures a dopant and accumulates the captured dopant. The capturing material may include carbon. The activation control material is a substance that promotes or suppresses the activation of the dopant. Suppressing the activation of the dopant is referred to as deactivation. The activation control material includes germanium (Ge). The dopant whose activation is promoted by the presence of germanium (Ge) may include boron (B). The dopant whose activation is suppressed by the presence of germanium (Ge) may include phosphorus (P). Therefore, the silicon-containing layer doped with boron (B) includes germanium (Ge) as its activation promoting material, and the silicon-containing layer doped with phosphorus (P) includes germanium (Ge) as its activation suppressing material, which is a deactivating material.

A distribution of the capturing material and the activation control material in the silicon-containing layer 200 may be varied. For example, the capturing material may be distributed neighboring the gate insulation layer 23, and the activation control material may be distributed over the region where the capturing material is distributed. Alternatively, the activation control material may be distributed neighboring the gate insulation layer 23, and the capturing material may be distributed over the region where the activation control material is distributed.

The region where the capturing material is distributed and the region where the activation control material is distributed may form a duplex layer structure. For example, a first layer including the capturing material and a second layer including the activation control material may be stacked. Also, a first layer including the activation control material and a second layer including the capturing material may be stacked.

In an exemplary embodiment, the silicon-containing layer 200 may include a first silicon-containing layer 24 including the capturing material and a second silicon-containing layer 25 including the activation control material. The silicon-containing layer 200 may further include a third silicon-containing layer 26 disposed over the second silicon-containing layer 25. The third silicon-containing layer 26 does not contain the capturing material or the activation control material.

The first silicon-containing layer 4, the second silicon-containing layer 25, and the third silicon-containing layer 26 may be provided by forming multiple silicon layers. Also, each of the first gate insulation layer 24, the second silicon-containing layer 25, or the third silicon-containing layer 26 may be formed of silicon to contain the capturing material and the activation control material in-situ.

Hereafter, an example in which the silicon-containing layer 200 may be formed of a sequential stack of the first silicon-containing layer 24, the second silicon-containing layer 25, and the third silicon-containing layer 26, will be described.

The first silicon-containing layer 24 is formed over the gate insulation layer 23. The first silicon-containing layer 24 may contain the capturing material. The capturing material captures and stores the dopant and diffuses the dopant during a subsequent annealing process. For example, the capturing material may include carbon. Therefore, the first silicon-containing layer 24 may be a carbon-containing silicon layer. When the amount of carbon is high, the activation of the dopant is suppressed. For example, the concentration of carbon may be less than or equal to approximately $10^{10}$ atoms/$cm^3$. To deposit the carbon-containing silicon layer, a carbon-containing gas and a silicon source gas may be used. The carbon-containing gas may include, for example, $C_2H_2$, and the silicon source gas may include, for example, $SiH_4$. The first silicon-containing layer 24 may have a thickness of approximately 50 Å to approximately 150 Å. The first silicon-containing layer 24 may include amorphous silicon. Therefore, the first silicon-containing layer 24 may be a carbon-containing amorphous silicon layer. The first silicon-containing layer 24 may be an undoped carbon-containing amorphous silicon layer.

Subsequently, the second silicon-containing layer 25 is formed over the first silicon-containing layer 24. The second silicon-containing layer 25 may contain the activation control material. The activation control material promotes or suppresses the activation of the dopant. For example, the activation control material may include germanium (Ge). Therefore, the second silicon-containing layer 25 may be a germanium-containing silicon layer that contains germanium (Ge). The activation of the dopant is controlled according to the amount of germanium (Ge). For example, the concentration of germanium (Ge) may range from approximately 20 at % to approximately 40 at %. To deposit the germanium-containing silicon layer, a germanium-containing gas and a silicon source gas may be used. The germanium-containing gas may include $GeH_4$, and the silicon source gas may include $SiH_4$. The second silicon-containing layer 25 may have a thickness of approximately 150 Å to approximately 200 Å. The second silicon-containing layer 25 may include amorphous silicon. Therefore, the second silicon-containing layer 25 may be a germanium-containing amorphous silicon layer. The second silicon-containing layer 25 may be an undoped germanium-containing amorphous silicon layer.

The activation rate of the dopant becomes different according to the concentration of the germanium (Ge) included in the second silicon-containing layer 25. For example, if the concentration of germanium (Ge) is greater than or equal approximately 40 at % the activation rate of phosphorus (P) is decreased drastically in the germanium-containing silicon layer doped with phosphorus (P). If the concentration of germanium (Ge) is approximately 25 at %, then the activation rate of phosphorus (P) is approximately 35%. In the germanium-containing silicon layer doped with boron (B), the concentration of germanium (Ge) is in proportion to the activation rate of boron (B). If the concentration of germanium (Ge) approximately 25 at % then the activation rate of boron (B) approximately 60%. The activation rate is represented by a ratio of activation during a subsequent annealing process compared with the implantation concentration of the dopant doping the silicon layer.

As described above, it may be seen that germanium (Ge) remarkably increases the activation rate of boron (B), but it suppresses the activation rate of phosphorus (P).

Therefore, a boron penetration phenomenon may be prevented by including the capturing material, such as carbon, in the silicon-containing layer 200. As a result, the polysilicon depletion ratio (PDR) characteristics may be improved.

Since the silicon-containing layer 200 includes the activation control material, such as germanium (Ge), the activation of boron (B) is promoted while the activation of phosphorus (P) is suppressed. Accordingly, the polysilicon depletion ratio (PDR) characteristics of the polysilicon gate may be improved even more. Moreover, since the activation of excess phosphorus (P) is suppressed, the breakdown voltage of the gate insulation layer may be prevented. In other words, deactivating the excess phosphorus (P) that is distributed around the gate insulation layer may prevent the breakdown of the gate insulation layer.

Subsequently, the third silicon-containing layer 26 is formed over the second silicon-containing layer 25. The third silicon-containing layer 26 does not include the capturing material or the activation control material. The third silicon-containing layer 26 may be formed using only the silicon source gas. The silicon source gas may include $SiH_4$. The third silicon-containing layer 26 may have a thickness of approximately 300 Å to approximately 400 Å. The third silicon-containing layer 26 may include amorphous silicon. Thus, the third silicon-containing layer 26 may be an undoped amorphous silicon layer.

The first silicon-containing layer 24, the second silicon-containing layer 25 and the third silicon-containing layer 26 may be deposited through a Chemical Vapor Deposition (CVD) process or an Atomic Layer Deposition (ALD) process.

As described above, the silicon-containing layer 200 contains the capturing material and the activation control material, and it may include the undoped amorphous silicon layer.

Figure 2B:
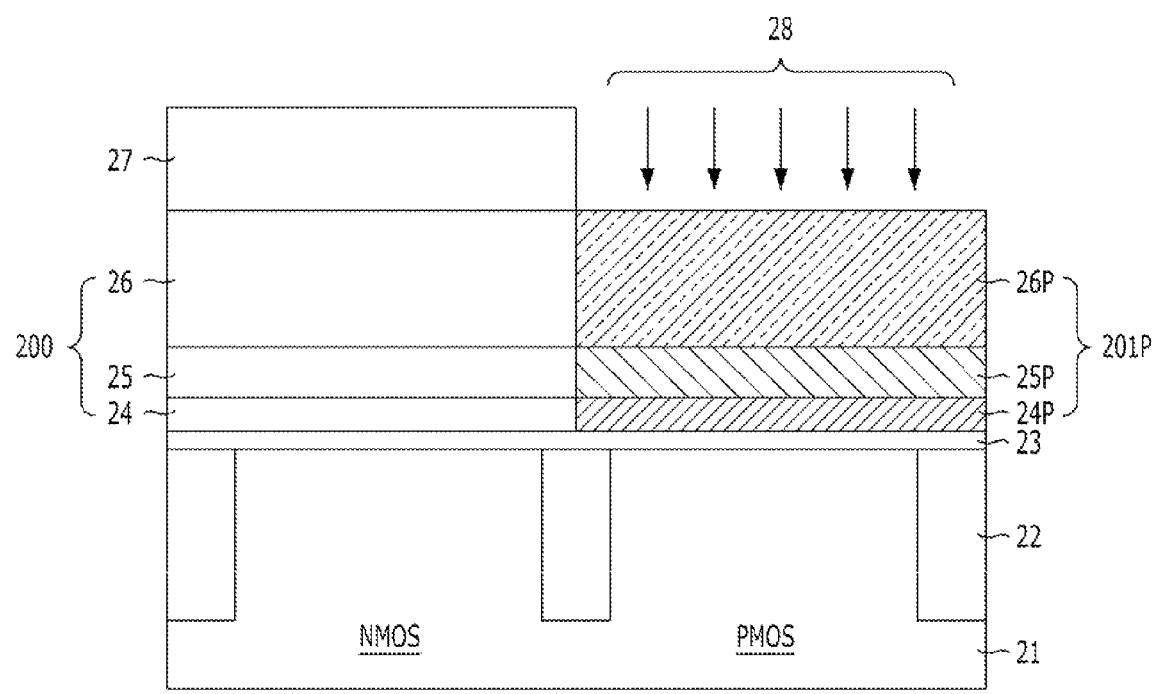

Referring to FIG. 2B, a first mask pattern 27 opening any one region between, is formed over the silicon-containing layer 200 to expose the first region, which is the PMOS, or the second NPMOS region. For example, the first mask pattern 27 may cover the second NPMOS region, while exposing the first region, which is the PMOS.

Subsequently, a first doping process 28 is performed to provide a first dopant, which is a material for providing conductivity. Since the first PMOS region is a PMOSFET region, the first dopant may include a P-type dopant. Examples of the P-type dopant may include boron (B). The first doping process 28 may be a plasma doping process or an implantation process. As for the doping source of boron (B), 11B, $49BF_2$, or $BF_3$ may be used.

When the first doping process 28 is performed, the silicon-containing layer 200 of the first region, which is the PMOS, is doped with the first dopant.

When the silicon-containing layer 200 is doped with the first dopant, the first silicon-containing layer 24, the second silicon-containing layer 25 and the third silicon-containing layer 26 of the first region, which is the PMOS are doped with the first dopant. In particular, the first dopant is captured and accumulated by the capturing material in the first silicon-containing layer 24.

As described above, with the doping of the first dopant, the silicon-containing layer 200 of the first region, which is the PMOS, becomes a P-type doped silicon-containing layer 201P. The P-type doped silicon-containing layer 201P may include a first P-type doped silicon-containing layer 24P, a second P-type doped silicon-containing layer 25P, and a third P-type doped silicon-containing layer 26P. The first P-type doped silicon-containing layer 24P further includes the capturing material, and the second P-type doped silicon-containing layer 25P further includes the activation control material. In the second NMOS region, the undoped silicon-containing layer 200 remains.

Figure 2C:
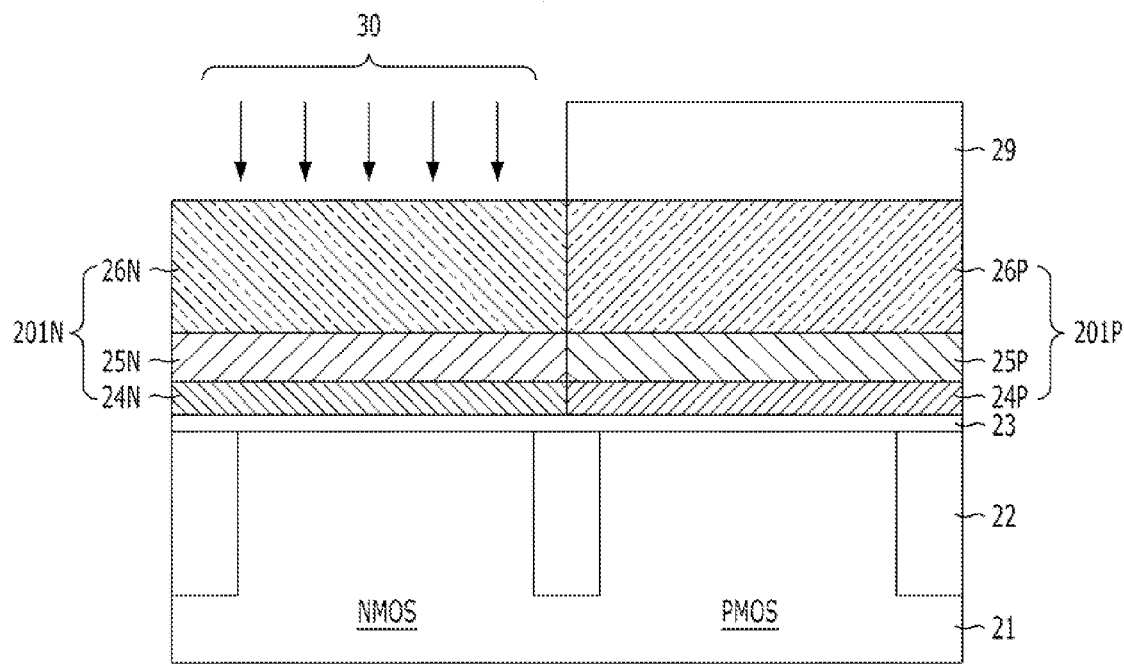

Referring to FIG. 2C, the first mask pattern 27 is removed. Subsequently, a second mask pattern 29, covering the first region, which is the PMOS, and exposing the second NMOS region is formed. The second mask pattern 29 covers the P-type doped silicon-containing layer 201P.

Subsequently, a second doping process 30 is performed to dope a second dopant, which is a material for providing conductivity. Since the second region is an NMOS region, the second dopant may include an N-type dopant. Examples of the N-type dopant may include phosphorus (P). The second doping process 30 may be a plasma doping process or an implantation process. As for the doping source of the second dopant, 31P may be used.

When the second doping process 30 is performed, the silicon-containing layer 200 of the second NMOS region is doped with the second dopant.

When the silicon-containing layer 200 is doped with the second dopant through the plasma doping process or the implantation process, the first silicon-containing layer 24, the second silicon-containing layer 25 and the third silicon-containing layer 26 of the second NPMOS region, are doped with the second dopant. In particular, the second dopant is captured and piled up by the capturing material in the first silicon-containing layer 24.

As described above, with the doping of the second dopant, the silicon-containing layer 200 of the second NPMOS region, becomes an N-type doped silicon-containing layer 201N. The N-type doped silicon-containing layer 201N may include a first N-type doped silicon-containing layer 24N, a second N-type doped silicon-containing layer 25N, and a third N-type doped silicon-containing layer 26N. The first N-type doped silicon-containing layer 24N further includes the capturing material, and the second N-type doped silicon-containing layer 25N further includes the activation control material.

Although not illustrated in the drawing, an annealing process may be performed after the second dopant is doped in order to diffuse the first dopant and the second dopant. The annealing process may be a rapid annealing process. The annealing process diffuses the first dopant and the second dopant, and the capturing material may accumulate the diffused dopant around the gate insulation layer 23.

Figure 2D:
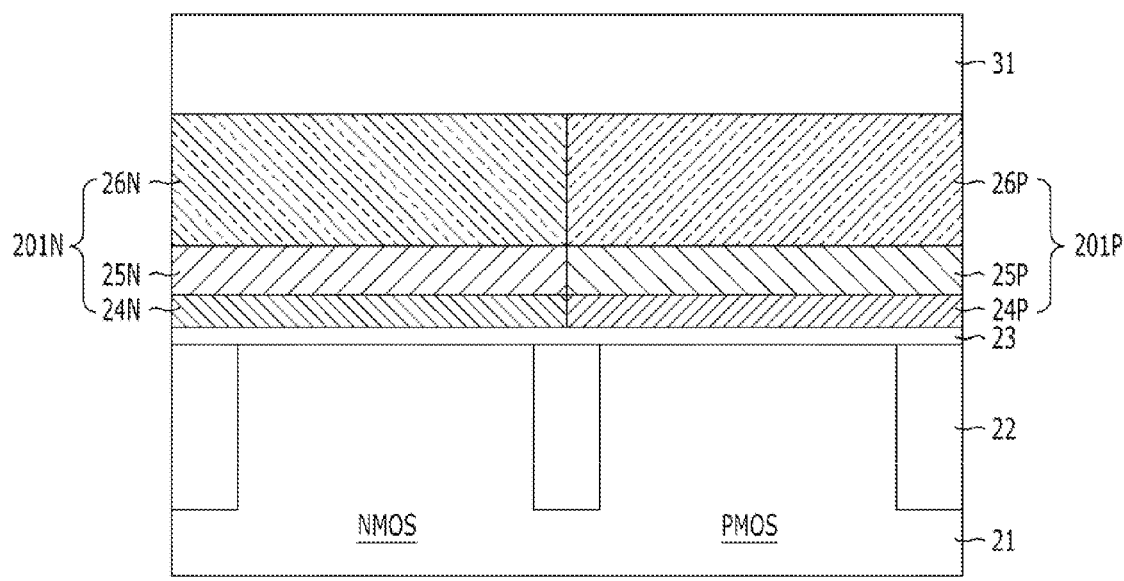

Referring to FIG. 2D, a metal-containing layer 31 may be formed over the P-type doped silicon-containing layer 201P and the N-type doped silicon-containing layer 201N. The metal-containing layer 31 may include a tungsten-containing material or a titanium-containing material. The metal-containing layer 31 may include, for example, tungsten, tungsten nitride, titanium nitride, or titanium.

Figure 2E:
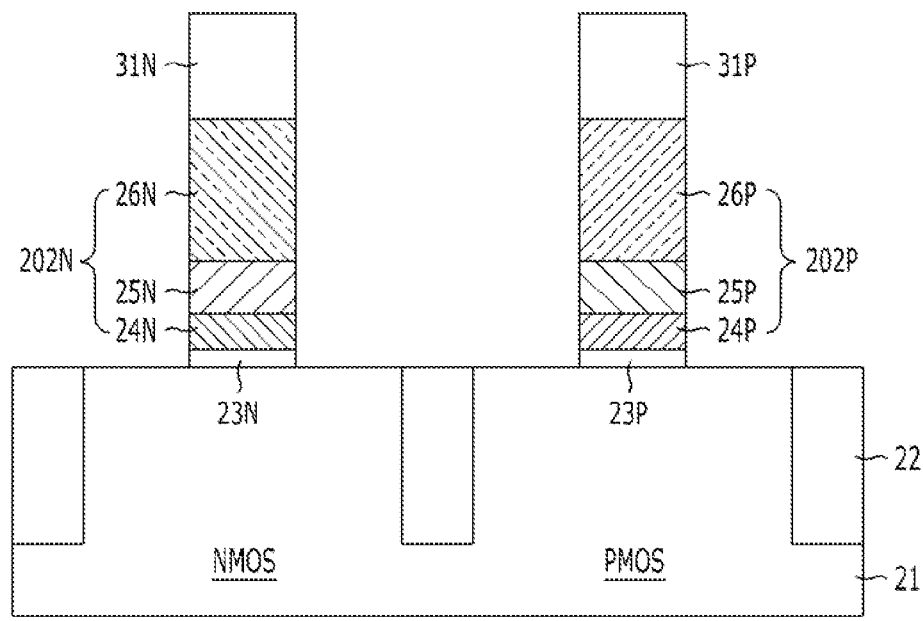

Referring to FIG. 2E, a gate etch process is performed. For example, the metal-containing layer 31, the P-type doped silicon-containing layer 201P, the N-type doped silicon-containing layer 201N, and the gate insulation layer 23 are etched by using a mask pattern (not shown) as an etch barrier. As a result, a gate structure is formed in each of the first PMOS region and the second NMOS region.

In the first PMOS region, a planar gate structure, including a stack formed of a first gate insulation layer 23P, a P-type doped silicon-containing electrode 202P, and a first metal electrode 31P, is formed. The P-type doped silicon-containing electrode 202P may include a first. P-type doped silicon-containing electrode 24P, a second P-type doped silicon-containing electrode 25P, and a third P-type doped silicon-containing electrode 26P. The first P-type doped silicon-containing electrode 24P may include the capturing material. The second P-type doped silicon-containing electrode 25P may include the activation control material. The third P-type doped silicon-containing electrode 26P does not contain the capturing material and the activation control material, and the third P-type doped silicon-containing electrode 26P is doped with a P-type dopant. The capturing material may include carbon, and the activation control material may include germanium (Ge). Carbon is a material that captures boron (B). Germanium (Ge) is a material that controls the activation of boron (B), and germanium (Ge) promotes the activation of boron (B).

In the second NMOS region, a planar gate structure, including a stack formed of a second gate insulation layer 23N, an N-type doped silicon-containing electrode 202N, and a second metal electrode 31N, is formed. The N-type doped silicon-containing electrode 202N may include a first N-type doped silicon-containing electrode 24N, a second N-type doped silicon-containing electrode 25N, and a third N-type doped silicon-containing electrode 26N. The first N-type doped silicon-containing electrode 24N may include the capturing material. The second N-type doped silicon-containing electrode 25N may include the activation control material. The third N-type doped silicon-containing electrode 26N does not contain the capturing material or the activation control material, and the third N-type doped silicon-containing electrode 26N is doped with an N-type dopant. The capturing material may include carbon, and the activation control material may include germanium (Ge). Carbon is a material that captures phosphorus (P). Germanium (Ge) is a material that controls the activation of phosphorus (P), and germanium (Ge) promotes the activation of phosphorus (P).

Although not illustrated in the drawing, a gate hard mask layer may be formed over the first metal electrode 31P and the second metal electrode 31N.

Although not illustrated in the drawing, a gate spacer forming process may be performed after a gate etch process. The gate spacer may be formed of a silicon oxide or a silicon nitride.

Figure 2F:
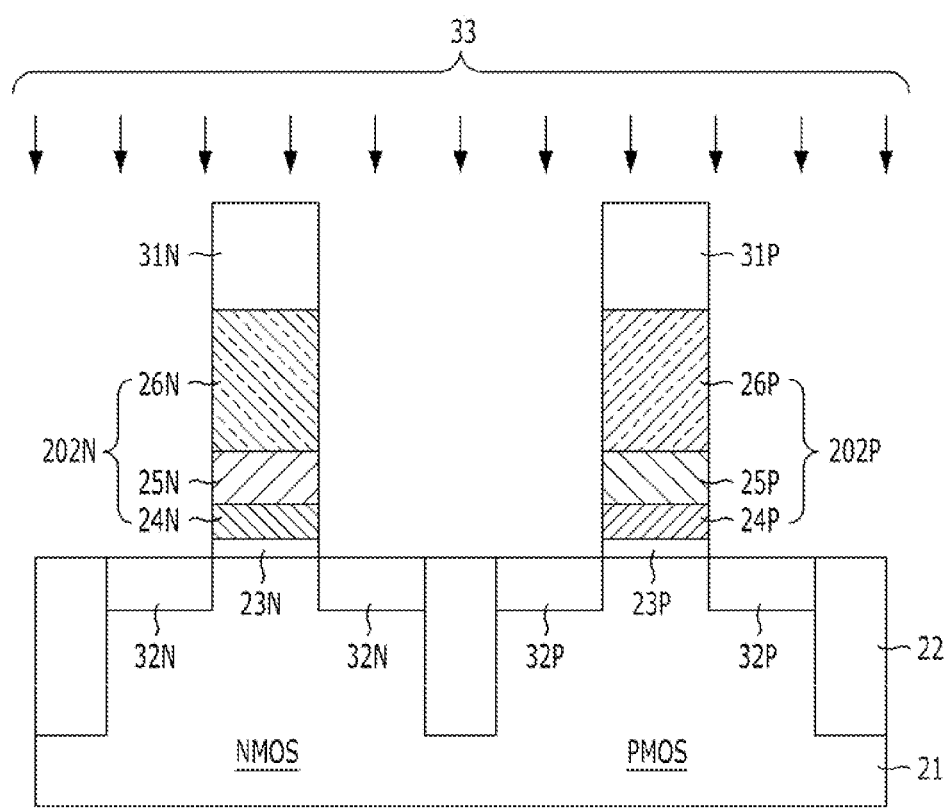

Referring to FIG. 2F, a P-type source/drain region 32P and an N-type source/drain region 32N are formed. To this end, a mask forming process is performed individually, and then a P-type dopant ion implantation and an N-type dopant ion implantation may be performed.

Subsequently, an annealing process 33 is performed. The annealing process 33 may be a rapid annealing process. The annealing process 33 is performed to activate the dopants implanted into the P-type source/drain region 32P and the N-type source/drain region 32N. The annealing process 33 is called an activation annealing process. The annealing process 33 may be performed by increasing temperature more than general activation annealing process. As a result, the first dopant and the second dopant accumulate around the gate insulation layer 23, thus improving the polysilicon depletion ratio (PDR).

When the annealing process 33 is performed, the dopants doping the P-type doped silicon-containing electrode 202P and the N-type doped silicon-containing electrode 202N are activated and diffused. Particularly, due to the diffusion, the P-type dopant and the N-type dopant may accumulate, respectively, in the first P-type doped silicon-containing electrode 24P and the first N-type doped silicon-containing electrode 24N. Also, the P-type doped silicon-containing electrode 202P and the N-type doped silicon-containing electrode 202N may be crystalized through the annealing process 33. As a result, the P-type doped silicon-containing electrode 202P and the N-type doped silicon-containing electrode 202N may become a P-type doped polysilicon electrode and an N-type doped polysilicon electrode, respectively, after the annealing process 33.

When the annealing process 33 is completed, a lower portion of the first P-type doped silicon-containing electrode 24P and a lower portion of the first N-type doped silicon-containing electrode 24N may be sufficiently doped, respectively, with the P-type dopant and the N-type dopant. Moreover, through the annealing process 33, the activation control material, which is germanium (Ge), activates the boron (B) captured by the first P-type doped silicon-containing electrode 24P of the P-type doped silicon-containing electrode 202P. Also, the activation control material, which is germanium (Ge), deactivates the surplus phosphorus (P) captured by the first N-type doped silicon-containing electrode 24N of the N-type doped silicon-containing electrode 202N.

In the above description, after the capturing material is included in the silicon-containing layer 200, the N-type dopant and the P-type dopant may be sufficiently doped by performing the first doping process 28, the second doping process 30, and the annealing process 33. To be specific, since continuous diffusing of the dopant is induced by performing the annealing process 33, sufficient amounts of the N-type dopant and the P-type dopant may be doped around the first gate insulation layer 23P and the second gate insulation layer 23N. Also, the capturing material included in the first P-type doped silicon-containing electrode 24P and the first N-type doped silicon-containing electrode 24N may prevent the P-type dopant and the N-type dopant from penetrating into the first gate insulation layer 23P, the second gate insulation layer 23N, and the channel region.

Also, since the dopants are kept from diffusing into the first gate insulation layer 23P, the second gate insulation layer 23N, and the channel region by disposing the capturing material over the first gate insulation layer 23P and the second gate insulation layer 23N, a process of nitriding the surface of the gate insulation layer for preventing the penetration of the dopant may be omitted. Therefore, since the dopant is not penetrated and diffused, the concentration of the dopant doping the silicon-containing electrode may be decreased. The decreased concentration of the dopant may be compensated for by using the activation efficiency of germanium (Ge).

Figure 3A:
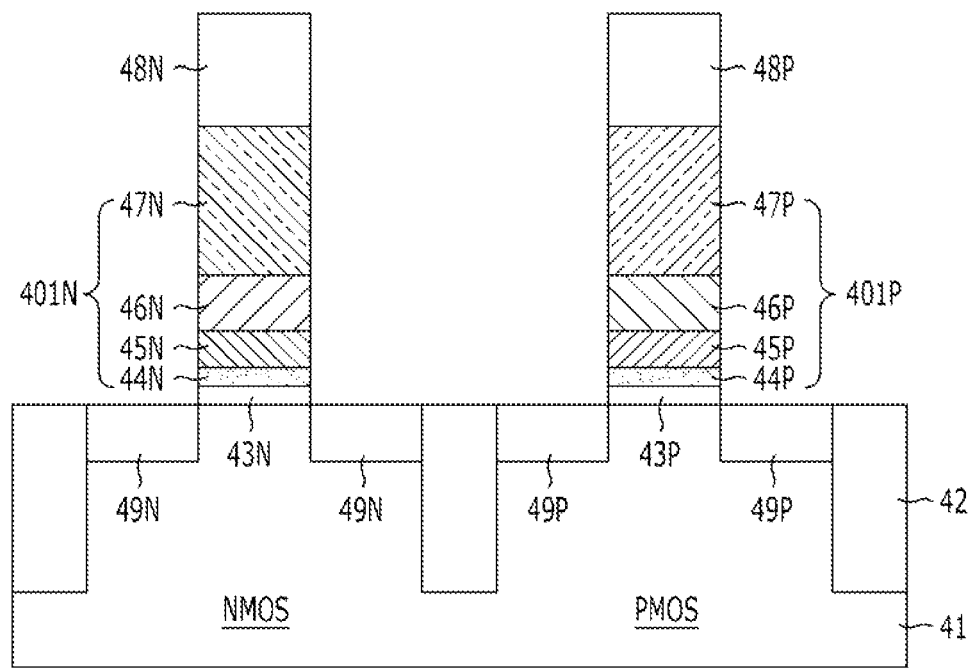
FIG. 3A is a cross-sectional view illustrating an exemplary CMOS circuit.
Figure 3B:
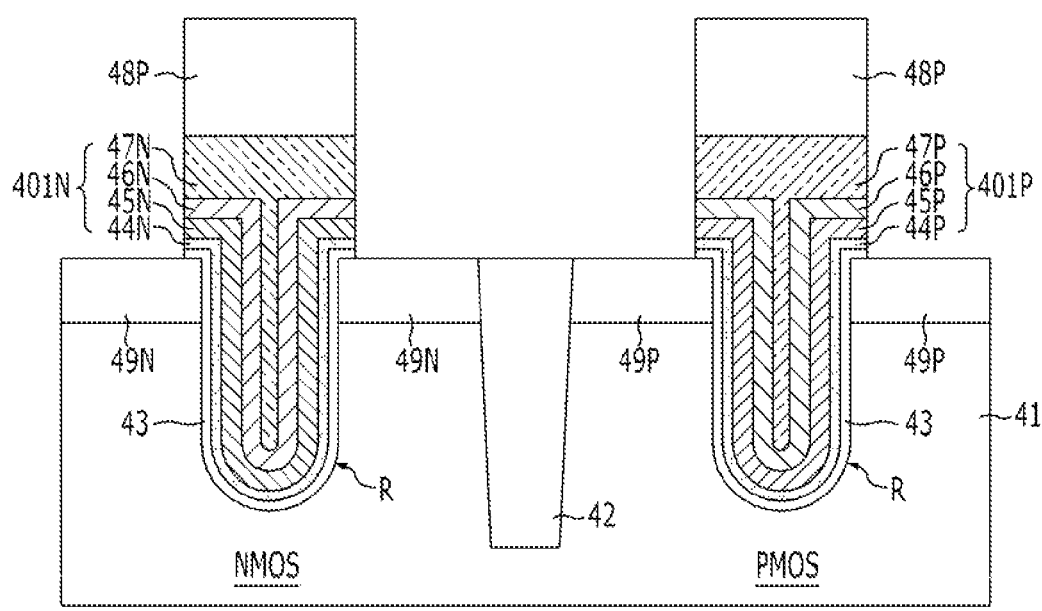
FIG. 3B is a cross-sectional view illustrating an exemplary modified CMOS circuit.

FIG. 3A is a cross-sectional view illustrating an exemplary CMOS circuit. FIG. 3B is a cross-sectional view illustrating a modified exemplary CMOS circuit. FIG. 3A is a CMOS circuit having a planar gate structure, whereas FIG. 3B is a CMOS circuit having a recess gate structure.

Referring to FIGS. 3A and 3B, a semiconductor substrate 41 includes a first region and a second region. The semiconductor substrate 41 also includes an isolation region 42 for isolating the first region and the second region from each other. The isolation region 42 is of a trench structure, which may be formed through a Shallow Trench Isolation (STI) process. The isolation region 42 may include an insulation layer, e.g., a silicon oxide layer. The first region and the second region may include a transistor region. The first region and the second region may include a PMOSFET region and an NMOSFET region, respectively. Hereafter, the first region where a PMOSFET is formed is a PMOS region, and the second region where an NMOSFET is formed is an NMOS region. The positions of the first PMOS region and the second NMOS region, are illustrated for the sake of convenience in description, and the positions may be switched with each other. The semiconductor substrate 41 may include a silicon substrate, a germanium substrate, or a silicon germanium substrate, but the scope and spirit of the embodiment of the present invention are not limited to them. Moreover, the entire semiconductor substrate or a part of the semiconductor substrate 41 may be strained.

A gate structure is formed over the semiconductor substrate 41 of each of the first PMOS region and the second NMOS region. The gate structures illustrated in FIG. 3A may include a planar gate structure. The planar gate structure is a gate structure where a horizontal channel is formed. The gate structures illustrated in FIG. 3B may include a recess gate structure. The recess gate structure is a gate structure formed in a recess pattern R. The recess gate structure has a longer channel length than the planar gate structure.

The gate structure of the first PMOS region may include a first gate insulation layer 43P, a P-type doped silicon-containing electrode 401P, and a first metal electrode 48P. A P-type source/drain region 49P is formed in the inside of the semiconductor substrate 41 on both sides of each gate structure. The first gate insulation layer 43P may include a silicon oxide or a high dielectric material. If the first gate insulation layer 43P includes a high dielectric material, then an interface layer, such as a silicon oxide layer or a silicon oxynitride layer, may be further formed between the semiconductor substrate 41 and the high dielectric material. The P-type doped silicon-containing electrode 401P may be doped with a P-type dopant and may further include a first capturing material and a first activation control material. The P-type doped silicon-containing electrode 401P may include a first P-type doped silicon-containing electrode 44P, a second P-type doped silicon-containing electrode 45P, a third P-type doped silicon-containing electrode 46P, and a fourth P-type doped silicon-containing electrode 47P. The P-type doped silicon-containing electrode 401P may include polysilicon. The P-type doped silicon-containing electrode 401P may include polysilicon produced by crystalizing amorphous silicon. The first P-type doped silicon-containing electrode 44P, the second P-type doped silicon-containing electrode 45P, the third P-type doped silicon-containing electrode 46P, and the fourth P-type doped silicon-containing electrode 47P may include doped polysilicon that is doped with a P-type dopant. The P-type dopant may include boron (B). The second P-type doped silicon-containing electrode 45P may include the first capturing material. The third P-type doped silicon-containing electrode 46P may include the first activation control material. The first capturing material may include carbon, and the first activation control material may include germanium (Ge). Germanium (Ge) controls the activation of boron (B) and promotes the activation of boron (8). The first metal electrode 48P may include a low-resistance material. For example, the first metal electrode 48P may include tungsten-containing material or titanium-containing material.

Referring to FIG. 3B the P-type doped silicon-containing electrode 401P fills the recess pattern R, and the first metal electrode 48P is formed over the P-type doped silicon-containing electrode 401P.

The gate structure of the second NPMOS region includes a second gate insulation layer 43N, an N-type doped silicon-containing electrode 401N, and a second metal electrode 48N.

An N-type source/drain region 49N is formed in the inside of the semiconductor substrate 41 on both sides of each gate structure. The second gate insulation layer 43N may include a silicon oxide or a high dielectric material. If the second gate insulation layer 43N includes a high dielectric material, then an interface layer, such as a silicon oxide layer or a silicon oxynitride layer, may be formed between the semiconductor substrate 41 and the high dielectric material. The N-type doped silicon-containing electrode 401N may be doped with an N-type dopant and may further include a second capturing material and a second activation control material. The N-type doped silicon-containing electrode 401N may include a first N-type doped silicon-containing electrode 44N, a second N-type doped silicon-containing electrode 45N, a third N-type doped silicon-containing electrode 46N, and a fourth N-type doped silicon-containing electrode 47N. The N-type doped silicon-containing electrode 401N may include polysilicon. The N-type doped silicon-containing electrode 401N may include polysilicon produced by crystalizing amorphous silicon. The first N-type doped silicon-containing electrode 44N, the second N-type doped silicon-containing electrode 45N, the third N-type doped silicon-containing electrode 46N, and the fourth N-type doped silicon-containing electrode 47N may include doped polysilicon that is doped with an N-type dopant. The N-type dopant may include phosphorus (P). The second N-type doped silicon-containing electrode 45N may include the second capturing material. The third N-type doped silicon-containing electrode 46N may include the second activation control material. The second capturing material may include carbon, and the second activation control material may include germanium (Ge). Germanium (Ge) controls the activation of phosphorus (P) and suppresses the activation of phosphorus (P). The second metal electrode 48N may include a low-resistance material. For example, the second metal electrode 48N may include tungsten-containing material or titanium-containing material.

Referring to FIG. 3B, the N-type doped silicon-containing electrode 401N fills the recess pattern R, and the second metal electrode 48N is formed over the N-type doped silicon-containing electrode 401N.

Referring to FIGS. 3A and 3B, the P-type doped silicon-containing electrode 401P includes the first capturing material and the first activation control material. The N-type doped silicon-containing electrode 401N includes the second capturing material and the second activation control material. Both the first capturing material and the second capturing material may include carbon, and both of the first activation control material and the second activation control material may include germanium (Ge). The first capturing material increases the concentration of the P-type dopant at the interface between the first gate insulation layer 43P and the P-type doped silicon-containing electrode 401P. The second capturing material increases the concentration of the N-type dopant at the interface between the second gate insulation layer 43N and the N-type doped silicon-containing electrode 401N. Thus, the polysilicon depletion ratio (PDR) of the NMOSFET and the PMOSFET may be improved and the current may be increased.

The first activation control material promotes activation, while the second activation control material suppresses activation. For example, the second activation control material suppresses activation of phosphorus (P), while the first activation control material promotes activation of boron (B). The first activation control material and the second activation control material include germanium (Ge). Germanium (Ge) suppresses the activation of phosphorus (P), while promoting the activation of boron (B). The germanium (Ge) included in the P-type doped silicon-containing electrode 401P activates the boron (B) captured by the second P-type doped silicon-containing electrode 45P. The activation of the dopant is controlled according to the amount of germanium (Ge). To be specific, the concentration of germanium (Ge) may range from approximately 20 at % to approximately 40 at %.

The concentration of phosphorus (P) may be increased by the second capturing material, but this brings about excessive accumulation of phosphorus (P), which leads to deteriorated gate breakdown voltage and threshold voltage Vt. Therefore, the activation of excess phosphorus (P) at the second N-type doped silicon-containing electrode 45N may be prevented by forming the third N-type doped silicon-containing electrode 46N containing the second activation control material. In other words, germanium (Ge), which is the second activation control material, deactivates phosphorus (P). Therefore, excess phosphorus (P) may be prevented from penetrating into the second gate insulation layer 43N and the channel region under the second gate insulation layer 43N.

Thus, first capturing material and the second capturing material improve the polysilicon depletion ratio (PDR) of the PMOSFET and the NMOSFET, and the second activation control material prevents the gate breakdown voltage and threshold voltage of the NMOSFET from being decreased. Moreover, the first activation control material increases the activation of boron (B).

Figure 4A:
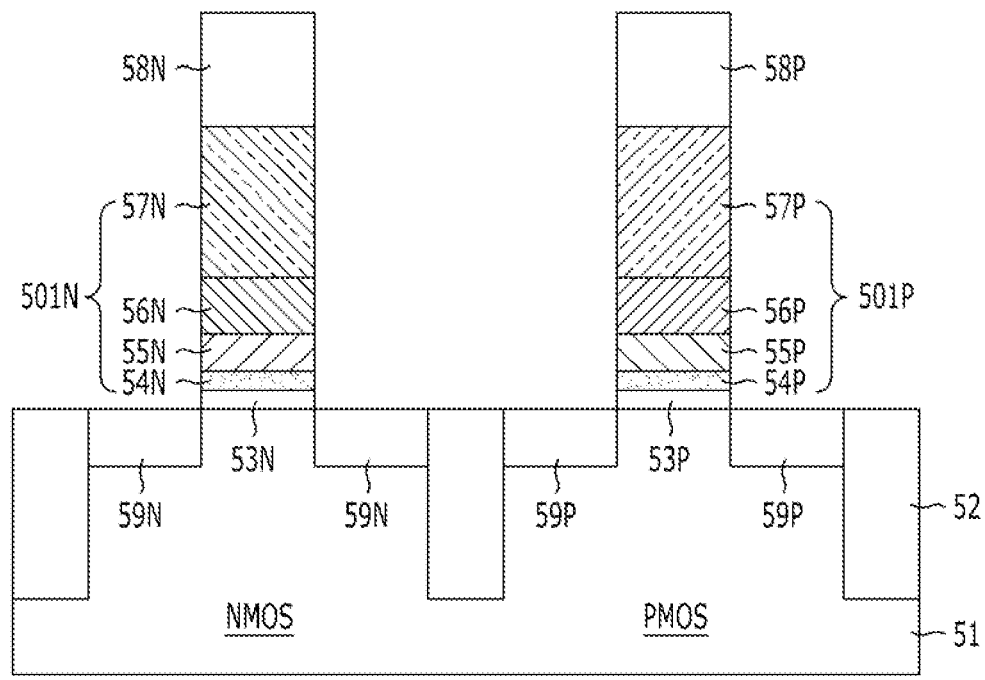
FIG. 4A is a cross-sectional view illustrating an exemplary CMOS circuit.
Figure 4B:
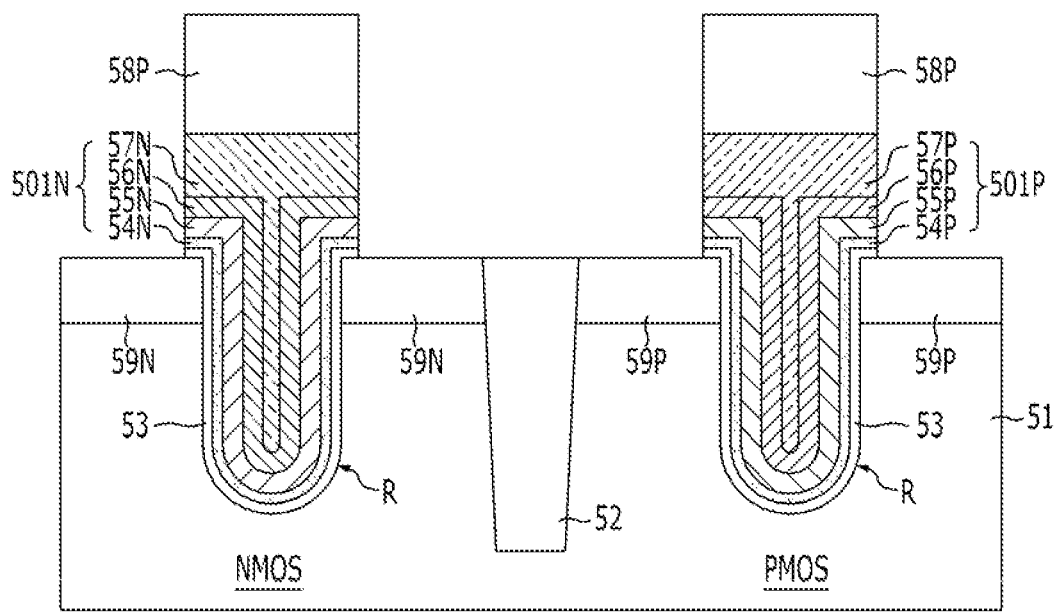
FIG. 4B is a cross-sectional view illustrating an exemplary CMOS circuit.

FIG. 4A is a cross-sectional view illustrating an exemplary CMOS circuit. FIG. 4B is a cross-sectional view illustrating a modified exemplary CMOS circuit. FIG. 4A is a CMOS circuit having a planar gate structure, whereas FIG. 4B is a CMOS circuit having a recess gate structure.

Referring to FIGS. 4A and 4B a semiconductor substrate 51 includes a first region and a second region. The semiconductor substrate 51 also includes an isolation region 52 for isolating the first region and the second region from each other. The isolation region 52 is of a trench structure, which may be formed through a Shallow Trench Isolation (STI) process. The isolation region 52 may include an insulation layer, e.g., a silicon oxide layer. The first region and the second region may include a transistor region. The first region and the second region may include a PMOSFET region and an NMOSFET region, respectively. Hereafter, the first region where a PMOSFET is formed is a PMOS region, and the second region where an NMOSFET is formed is an NMOS region. The positions of the first PMOS region and the second NMOS region, are illustrated for the sake of convenience in description, and the positions may be switched with each other. The semiconductor substrate 51 may include, for example, a silicon substrate, a germanium substrate, or a silicon germanium substrate. Moreover, the entire or part of the semiconductor substrate 51 may be strained.

A gate structure is formed over the semiconductor substrate 51 of each of the first PMOS region and the second NMOS region. The gate structures illustrated in FIG. 4A may include a planar gate structure. The planar gate structure is a gate structure where a horizontal channel is formed. The gate structures illustrated in FIG. 4B may include a recess gate structure. The recess gate structure is a gate structure formed in a recess pattern R. The recess gate structure has a longer channel length than the planar gate structure.

The gate structure of the first PMOS region may include a first gate insulation layer 53P, a P-type doped silicon-containing electrode 501P, and a first metal electrode 58P. A P-type source/drain region 59P is formed in the inside of the semiconductor substrate 51 on both sides of each gate structure. The first gate insulation layer 53P may include a silicon oxide or a high dielectric material. If the first gate insulation layer 53P includes a high dielectric material, then an interface layer, such as a silicon oxide layer or a silicon oxynitride layer, may be formed between the semiconductor substrate 51 and the high dielectric material. The P-type doped silicon-containing electrode 501P may be doped with a P-type dopant and may further include a first capturing material and a first activation control material. The P-type doped silicon-containing electrode 501P may include a first P-type doped silicon-containing electrode 54P, a second P-type doped silicon-containing electrode 55P, a third P-type doped silicon-containing electrode 56P, and a fourth P-type doped silicon-containing electrode 57P. The P-type doped silicon-containing electrode 501P may include polysilicon. The P-type doped silicon-containing electrode 501P may include polysilicon produced by crystalizing amorphous silicon. The first P-type doped silicon-containing electrode 54P, the second P-type doped silicon-containing electrode 55P, the third P-type doped silicon-containing electrode 56P, and the fourth P-type doped silicon-containing electrode 57P may include doped polysilicon which is doped with a P-type dopant. The P-type dopant may include boron (B). The second P-type doped silicon-containing electrode 55P may include the first activation control material. The third P-type doped silicon-containing electrode 56P may include the first capturing material. The first capturing material may include carbon, and the first activation control material may include germanium (Ge). Germanium (Ge) controls the activation of boron (B) and promotes the activation of boron (B). The first metal electrode 58P may include a low-resistance material. For example, the first metal electrode 58P may include a tungsten-containing material or a titanium-containing material.

Referring to FIG. 4B, the P-type doped silicon-containing electrode 501P fills the recess pattern R, and the first metal electrode 58P is formed over the P-type doped silicon-containing electrode 501P.

The gate structure of the second NMOS region may include a second gate insulation layer 53N, an N-type doped silicon-containing electrode 501N, and a second metal electrode 58N.

An N-type source/drain region 59N is formed in the inside of the semiconductor substrate 51 on both sides of each gate structure. The second gate insulation layer 53N may include a silicon oxide or a high dielectric material. If the second gate insulation layer 53N includes a high dielectric material, then an interface layer, such as a silicon oxide layer or a silicon oxynitride layer, may be formed between the semiconductor substrate 51 and the high dielectric material. The N-type doped silicon-containing electrode 501N may be doped with an N-type dopant and may further include a second capturing material and a second activation control material. The N-type doped silicon-containing electrode 501N may include a first N-type doped silicon-containing electrode 54N, a second N-type doped silicon-containing electrode 55N, a third N-type doped silicon-containing electrode 56N, and a fourth N-type doped silicon-containing electrode 57N. The N-type doped silicon-containing electrode 501N may include polysilicon. The N-type doped silicon-containing electrode 501N may include polysilicon produced by crystalizing amorphous silicon. The first N-type doped silicon-containing electrode 54N, the second N-type doped silicon-containing electrode 55N, the third N-type doped silicon-containing electrode 55N, and the fourth N-type doped silicon-containing electrode 57N may include doped polysilicon that is doped with an N-type dopant. The N-type dopant may include phosphorus (P). The second N-type doped silicon-containing electrode 55N may include the second activation control material. The third N-type doped silicon-containing electrode 56N may include the second capturing material. The second capturing material may include carbon, and the second activation control material may include germanium (Ge). Germanium (Ge) controls the activation of phosphorus (P) and suppresses the activation of phosphorus (P). The second metal electrode 58N may include a low-resistance material. For example, the second metal electrode 58N may include a tungsten-containing material or a titanium-containing material.

Referring to FIG. 4B, the N-type doped silicon-containing electrode 501N fills the recess pattern R, and the second metal electrode 58N is formed over the N-type doped silicon-containing electrode 501N.

Referring to FIGS. 4A and 4B, the P-type doped silicon-containing electrode 501P includes the first capturing material and the first activation control material. The N-type doped silicon-containing electrode 501N includes the second capturing material and the second activation control material. Both the first capturing material and the second capturing material may include carbon, and both the first activation control material and the second activation control material may include germanium (Ge). The first capturing material increases the concentration of the P-type dopant at the interface between the first gate insulation layer 53P and the P-type doped silicon-containing electrode 501P. The second capturing material increases the concentration of the N-type dopant at the interface between the second gate insulation layer 53N and the N-type doped silicon-containing electrode 501N. In this way, the polysilicon depletion ratio (PDR) of the NMOSFET and the PMOSFET may be improved and the current may be increased.

The first activation control material promotes activation, while the second activation control material suppresses activation. For example, the second activation control material suppresses activation of phosphorus (P), while the first activation control material promotes activation of boron (B). The first activation control material and the second activation control material include germanium (Ge). Germanium (Ge) suppresses the activation of phosphorus (P), while promoting the activation of boron (B). The germanium (Ge) included in the P-type doped silicon-containing electrode 501P activates the boron (B) captured by the third P-type doped silicon-containing electrode 56P. The activation of the dopant is controlled according to the amount of germanium (Ge). To be specific, the concentration of germanium (Ge) may range from approximately 20 at % to approximately 40 at %.

The concentration of phosphorus (P) may be increased by the second capturing material, but this brings about an excessive accumulation of phosphorus (P), which leads to deteriorated gate breakdown voltage and threshold voltage Vt. Therefore, the accumulation of excess phosphorus (P) in the third N-type doped silicon-containing electrode 56N may be prevented from being activated by forming the second N-type doped silicon-containing electrode 55N containing the second activation control material. In other words, germanium (Ge), which is the second activation control material, induces deactivation of phosphorus (P), and accordingly, the excess accumulated phosphorus (P may be prevented from penetrating into the second gate insulation layer 53N and the channel region under the second gate insulation layer 53N.

After all, the first capturing material and the second capturing material improve the polysilicon depletion ratio (PDR) of the PMOSFET and the NMOSFET, and the second activation control material prevents the gate breakdown voltage and threshold voltage of the NMOSFET from being decreased. Moreover, the first activation control material increases the activation of boron (B).

An exemplary CMOS circuit may be applied, for example, in a Dynamic Random Access Memory (DRAM), a Static Random Access Memory (SRAM), a flash memory, a Ferroelectric Random Access Memory (FeRAM), a Magnetic Random Access Memory (MRAM), a Phase-Change Random Access Memory (PRAM), or the like.

Figure 5:
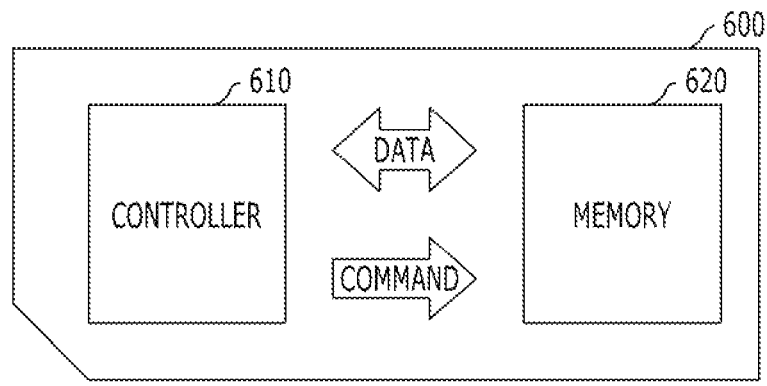
FIG. 5 illustrates an exemplary memory card.

FIG. 5 illustrates an exemplary memory card.

Referring to FIG. 5, the exemplary memory card 600 may include a controller 610 and a memory 620. The controller 610 and the memory 620 may exchange electrical signals with each other. For example, the memory 620 and the controller 610 may receive and transfer data under the command of the controller 610. Accordingly, the memory card 600 may store data in the memory 620, or output data from the memory 620 to the outside. A particular part of the memory 620, which is a peripheral circuit region, may include the CMOS circuit described above. The memory card 600 may be used as a data storage medium for diverse portable devices. For example, the memory card 600 may include a memory stick card, a smart media (SM) card, a secure digital (SD) card, a mini secure digital (SD) card, or a multi-media card (MMC).

Figure 6:
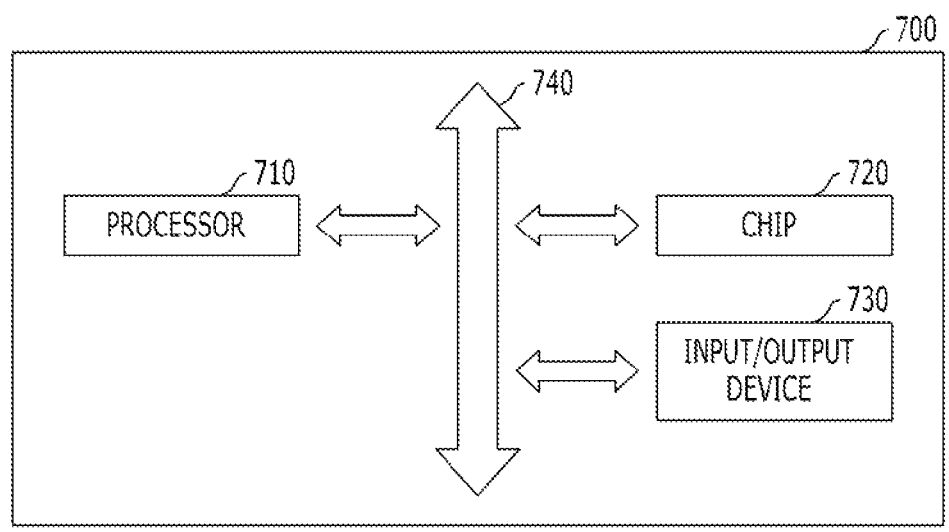
FIG. 6 is a block view illustrating an exemplary electronic system.

FIG. 6 is a block view illustrating an exemplary electronic system. Referring to FIG. 6, the exemplary electronic system 700 may include a processor 710, an input/output device 730, and a chip 720. The processor 710, the input/output device 730, and the chip 720 participate in data communication through buses 740. The processor 710 runs a program and controls the electronic system 700. The input/output device 730 is used to input/output data of the electronic system 700. The electronic system 700 is connected to an external device, such as a personal computer or a network, and exchanges data with the external device by using the input/output device 730. The chip 720 may store codes and data for operating the processor 710, and process part of an operation ordered by the processor 710. For example, the chip 720 may include the CMOS circuit that is described above. The electronic system 700 may form diverse electronic control devices requiring the chip 720. For example, the electronic system 700 may be used for a mobile phone, an MP3 player, a navigator, a Solid State Disk (SSD), household appliances, and the like.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, the method comprising:
    forming a gate insulation layer over a semiconductor substrate;
    forming an undoped silicon-containing layer over the gate insulation layer;
    forming a doped silicon-containing layer by doping the undoped silicon-containing layer with a dopant; and
    forming a gate electrode by etching the doped silicon-containing layer,
    wherein the undoped silicon-containing layer includes a capturing material and an activation control material, wherein the capturing material includes carbon to capture the dopant, wherein activation control material includes germanium to control an activation of the dopant,
    wherein the undoped silicon-containing layer has a multilayer structure, comprising:
        a first silicon-containing layer including the capturing material; and
        a second silicon-containing layer including the activation control material and stacked over the first silicon-containing layer,
        wherein the first silicon-containing layer does not include the activation control material.

2. The method of claim 1, further comprising:
    forming a source region and a drain region on opposite sides of the gate electrode; and
    annealing a resultant structure of the forming the source region and the drain region.

3. The method of claim 1,
    wherein each of the first silicon-containing layer and the second silicon-containing layer includes undoped silicon layer.

4. The method of claim 1, wherein each of the first silicon-containing layer and the second silicon-containing layer includes undoped amorphous silicon layer.

5. A method for fabricating a CMOS circuit, the method comprising:
    forming a gate insulation layer over a semiconductor substrate having an NMOSFET region and a PMOSFET region;
    forming an undoped amorphous silicon layer over the gate insulation layer;
    forming a P-type doped amorphous silicon layer and an N-type doped amorphous silicon layer by doping the undoped amorphous silicon layer with a P-type dopant and an N-type dopant, respectively;
    forming gate structures by etching the P-type doped amorphous silicon layer and the N-type doped amorphous silicon layer; and
    annealing to activate the P-type dopant and the N-type dopant,
    wherein the undoped amorphous silicon layer contains a capturing material and an activation control material, wherein the capturing material includes carbon to capture the P-type dopant and the N-type dopant, wherein the activation control material includes germanium to control an activation of the P-type dopant and the N-type dopant,
    wherein the undoped amorphous silicon layer has a multi-layer structure, comprising:
        a first undoped amorphous silicon layer including the capturing material; and
        a second undoped amorphous silicon layer including the activation control material and stacked over the first undoped amorphous silicon layer.
        wherein the first undoped amorphous silicon layer does not include the activation control material.

6. The method of claim 5, wherein the germanium has a concentration of approximately 20 at % to approximately 40 at %.

* * * * *